United States Patent
Shojaie et al.

(10) Patent No.: US 10,847,450 B2
(45) Date of Patent: Nov. 24, 2020

(54) COMPACT WIREBONDING IN STACKED-CHIP SYSTEM IN PACKAGE, AND METHODS OF MAKING SAME

(71) Applicant: INTEL CORPORATION, Santa Clara, CA (US)

(72) Inventors: Saeed Shojaie, Folsom, CA (US); Hyoung Il Kim, Folsom, CA (US); Bilal Khalaf, Folsom, CA (US); Min-Tih Ted Lai, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/326,279

(22) PCT Filed: Sep. 28, 2016

(86) PCT No.: PCT/US2016/054144
§ 371 (c)(1),
(2) Date: Feb. 18, 2019

(87) PCT Pub. No.: WO2018/063188
PCT Pub. Date: Apr. 5, 2018

(65) Prior Publication Data
US 2019/0181072 A1     Jun. 13, 2019

(51) Int. Cl.
*H01L 23/00*     (2006.01)
*H01L 25/00*     (2006.01)
(Continued)

(52) U.S. Cl.
CPC .......... *H01L 23/4952* (2013.01); *H01L 23/00* (2013.01); *H01L 23/495* (2013.01);
(Continued)

(58) Field of Classification Search
CPC ..... H01L 23/4952; H01L 25/50; H01L 23/00; H01L 23/495; H01L 24/48; H01L 24/49;
(Continued)

(56) References Cited

U.S. PATENT DOCUMENTS 5,847,445 A * 12/1998 Wark ............... H01L 23/16
257/669
2002/0056924 A1   5/2002 Chung et al.
(Continued)

FOREIGN PATENT DOCUMENTS

JP           6436030 A      2/1989
WO     WO-2018063188 A1   4/2018

OTHER PUBLICATIONS

"International Application Serial No. PCT/US2016/054144, International Search Report dated Jun. 7, 2017", 3 pgs.
(Continued)

*Primary Examiner* — Kyoung Lee
(74) *Attorney, Agent, or Firm* — Schwegman Lundberg & Woessner, P.A.

(57) ABSTRACT

A bond-wire system including a wire bond that is deflected above a dielectric ridge at a die edge. The deflected wire bond allows for both a lowered Z-profile and a reduced X-Y footprint. The bond-wire system may include a stacked-die configuration where a stacked die is wire bonded and the stacked-die bond wire is deflected above a dielectric ridge at the stacked die edge.

9 Claims, 6 Drawing Sheets

(51) Int. Cl.
    *H01L 23/495*     (2006.01)
    *H01L 25/065*     (2006.01)

(52) U.S. Cl.
CPC .............. *H01L 24/48* (2013.01); *H01L 24/49* (2013.01); *H01L 24/85* (2013.01); *H01L 25/0657* (2013.01); *H01L 25/50* (2013.01); *H01L 2224/04042* (2013.01); *H01L 2224/05554* (2013.01); *H01L 2224/06133* (2013.01); *H01L 2224/06135* (2013.01); *H01L 2224/32145* (2013.01); *H01L 2224/32225* (2013.01); *H01L 2224/45015* (2013.01); *H01L 2224/48091* (2013.01); *H01L 2224/48227* (2013.01); *H01L 2224/48471* (2013.01); *H01L 2224/48993* (2013.01); *H01L 2224/49113* (2013.01); *H01L 2224/73265* (2013.01); *H01L 2224/78301* (2013.01); *H01L 2224/85186* (2013.01); *H01L 2224/92247* (2013.01); *H01L 2225/0651* (2013.01); *H01L 2225/06562* (2013.01); *H01L 2924/00014* (2013.01); *H01L 2924/15311* (2013.01)

(58) Field of Classification Search
CPC ................. H01L 24/85; H01L 25/0657; H01L 2924/15311
See application file for complete search history.

(56) References Cited

U.S. PATENT DOCUMENTS

| | | | |
|---|---|---|---|
| 2006/0180906 | A1 | 8/2006 | Ding |
| 2008/0026506 | A1* | 1/2008 | Kim ........................ H01L 24/48 438/109 |
| 2008/0150111 | A1 | 6/2008 | Hiller et al. |
| 2014/0191417 | A1* | 7/2014 | Tan ......................... H01L 24/49 257/777 |

OTHER PUBLICATIONS

"International Application Serial No. PCT/US2016/054144, Written Opinion dated Jun. 7, 2017", 9 pgs.

"International Application Serial No. PCT/US2016/054144, International Preliminary Report on Patentability dated Apr. 11, 2019", 11 pgs.

* cited by examiner

COMPACT WIREBONDING IN STACKED-CHIP SYSTEM IN PACKAGE, AND METHODS OF MAKING SAME

CLAIM OF PRIORITY

This patent application is a U.S. National Stage Application under 35 U.S.C. 371 from International Application No. PCT/US2016/0541.44, filed Sep. 28, 2016, published as WO2018/063188, which is incorporated herein by reference.

FIELD

This disclosure relates to wire bonding, chip-scale packaging (CSP) of systems-in-package (SiP) devices including stacked chip configurations.

BACKGROUND

Computing devices such as mobile telephones, smart phones and tablet computers are restricted in available space because there are size limitations dictated by intended use. Size reduction presents challenges for packaging, both in height and in footprint.

BRIEF DESCRIPTION OF THE DRAWINGS

Various disclosed embodiments of are illustrated by way of example, and not by way of limitation, in the figures of the accompanying drawings and in which.

DETAILED DESCRIPTION

Figure 1:
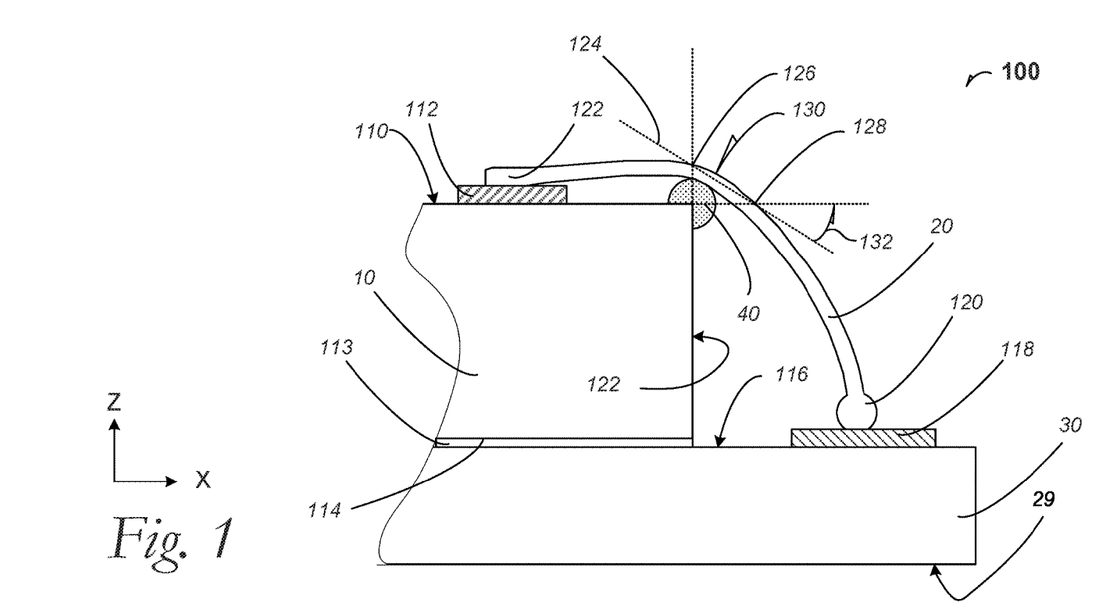
FIG. 1 is a cross-section elevation of a wire-bonded die according to an embodiment.

FIG. 1 is a cross-section elevation of a wire-bonded die 10 as part of a semiconductive device in a package 100 according to an embodiment. A first bond wire 20 is configured between a first die 10 and a package substrate 30. The first die 10 includes an active surface 110 and a first bond pad 112. The first die 10 also includes a backside surface 114 that is disposed on the package substrate 30 against a mounting surface 116. In an embodiment, an adhesive layer 113 bonds the first die 10 to the package substrate 30. Hereinafter and for all embodiments, it may be understood that a wire-bonded die may be adhered to a package substrate by an adhesive layer, as well as a die or and intervening structure may be adhered to device by an adhesive layer. The package substrate 30 includes a first package bond finger 118 on the mounting surface 116. In an embodiment, the processor first die 10 is a processor die such as that made by Intel Corporation of Santa Clara, Calif.

A first dielectric ridge 40 is disposed on and extending above the first die 10 at an edge that defines a corner between the active surface 110 and a first sidewall 122 of the first die 10. The first bond wire 20 is bonded to the first die bond pad 112 on the active surface 110, and the first bond wire 20 arcs above the first dielectric ridge 40, and the first bond wire 20 is bonded to the first bond finger 118 on the package substrate 30.

In an embodiment, the first bond wire 20 contacts the first dielectric ridge 40. The first dielectric ridge 40 may also be referred to as an electrically non-conductive material 40 on the first die 10 edge.

In an embodiment, the first bond wire 20 both contacts and exhibits arc deflection at the first dielectric ridge 40. The first bond wire 20 includes a capillary start enlargement 120 on the first bond finger 118 and a capillary end position 122 on the first bond pad 112. Consequently, the first bond wire 20 pivots at the first dielectric ridge 40 to obtain a lower Z-profile. Also with the first bond wire 20 both contacting and pivoting from the first dielectric ridge 40, the issue of wire sweep during protective overmolding and during other processing is diminished in favor of fewer bond wire-to-bond wire shorts.

In an embodiment, the non-conductive composition of a dielectric ridge is an epoxy paste that is formed as a bead and at least partially cured. In an embodiment after affixing the first bond wire 20 to pivot at a partially cured epoxy first dielectric ridge 40, further curing is carried out such that a ridge notch may further allow the first bond wire to resist wire sweep during further processing. In an embodiment, a film-over-wire (FOW) material is used as understood by current processing technologies. In an embodiment, a film-over-die (FOD) material is used as understood by current processing technologies.

Figure 1A:
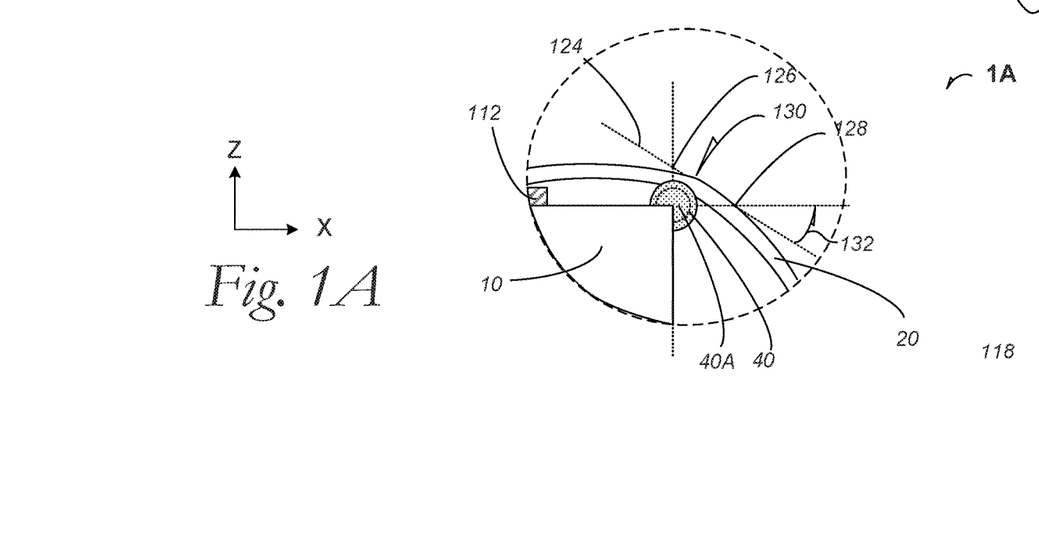
FIG. 1A is detail of the cross-section elevation 100 depicted in FIG. 1 according to an embodiment.

FIG. 1A is detail of the cross-section elevation 100 depicted in FIG. 1 according to an embodiment. In an embodiment, the first dielectric ridge 40 includes a more rigid core 40A such that the first bond wire 20 sinks into the material of the first dielectric ridge 40 but stops at the more ridged core 40A (illustrated in ghosted lines).

Reference is again made to FIG. 1.

In an embodiment, the first dielectric ridge 40 is cornice-configured on the active surface 110 and overhanging onto the first sidewall 122. Although the first dielectric ridge 40 is depicted in cross-section as a semicircle in FIG. 1, it may be appreciated that although the first dielectric ridge 40, actual processing may result in a non-circular cross-section profile. It may be appreciated that the first dielectric ridge 40 may only extend above the first active surface 110, and not onto the first sidewall 122, sufficiently to prevent shorting of the first bond wire 20 onto the active surface 110. In any event where the first dielectric ridge 40 may be disposed only on the active surface 110, it is proximate the first sidewall 122.

The wire shape of the first bond wire 20 may also be described by observing the projection of the active surface 110 (in the positive X-direction) and projection of the first sidewall 122 (in the positive Z-direction) such that an intersecting line 124 creates a first intersection 126 and a second intersection 128. In an embodiment, the first intersection 126 is formed between the first sidewall 122 projection and the intersecting line 124 at the first bond wire 20 as illustrated. In an embodiment, the second intersection 128 is formed between the first active surface 110 projection and the intersecting line 124 also at the first bond wire 20 as illustrated. It may now be appreciated that the first bond wire 20 exhibits the most deflection 130 between the first intersection 126 and the second intersection 128 according to an embodiment.

Closer scrutiny of where the intersecting lines occur may be quantified by reviewing FIG. 1A where the outer portion of the first bond wire 20, distal from the first die 10 is the occurrence of the first intersection 126 and the second intersection 128.

Deflection of the first bond wire 20 near the first dielectric ridge 40 may be quantified in one embodiment by an active surface angle 132 drawn between the first active surface 110 projection and the intersecting line 124. In an embodiment, the active surface angle 132 is at most a right angle.

Figure 2A:
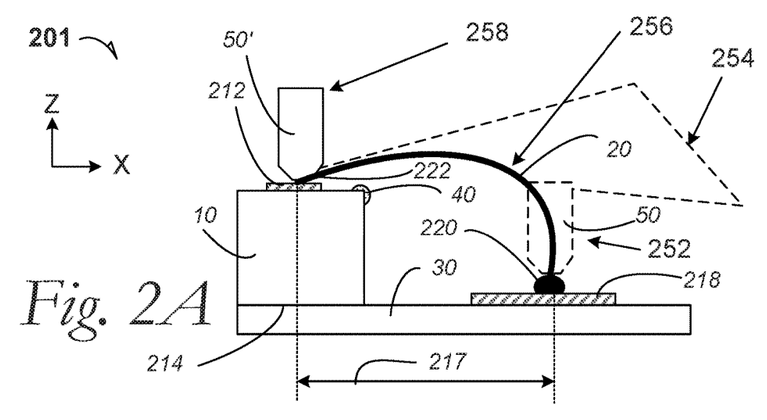
FIG. 2A is a cross-section elevation of a wire-bonded die demonstrating processing according to an embodiment.

FIG. 2A is a cross-section elevation of a wire-bonded die 201 demonstrating wire-bond processing according to an embodiment. A first die 10 is disposed on a package substrate 30 and a first bond wire 20 arcs over a first dielectric ridge 40 between a first active surface bond pad 212 and a first bond finger 218. Processing is described by dashed lines and ghosted figures to show motion of a capillary device 50 (in ghosted outline) where it begins 50 and where it ends 50'.

In an embodiment, the capillary device 50 both supplies bond-wire precursor material and heats the precursor material to effect a useful bond-wire arc by manipulating precursor material temperature. In an embodiment, the capillary device 50 both supplies bond-wire precursor material and is moved in space to effect a useful bond-wire shape. In this embodiment, a capillary device start position 252 creates a capillary start enlargement 220. A first movement is substantially vertical (in the positive Z-direction) as the capillary start position 252. Next, a capillary path is indicated by four linear movements of the capillary device 50 that traces out a capillary path 254 above the dielectric ridge 40 until a capillary end position 50' is reached. A resulting bond-wire shape 256 is depicted between the package substrate bond finger 218 and the first bond pad 212. A characteristic distance 217 is quantified by center-line projections from a center symmetry line of the capillary start enlargement 220 on the first bond finger 218 and the center of the first bond pad 212.

Figure 2B:
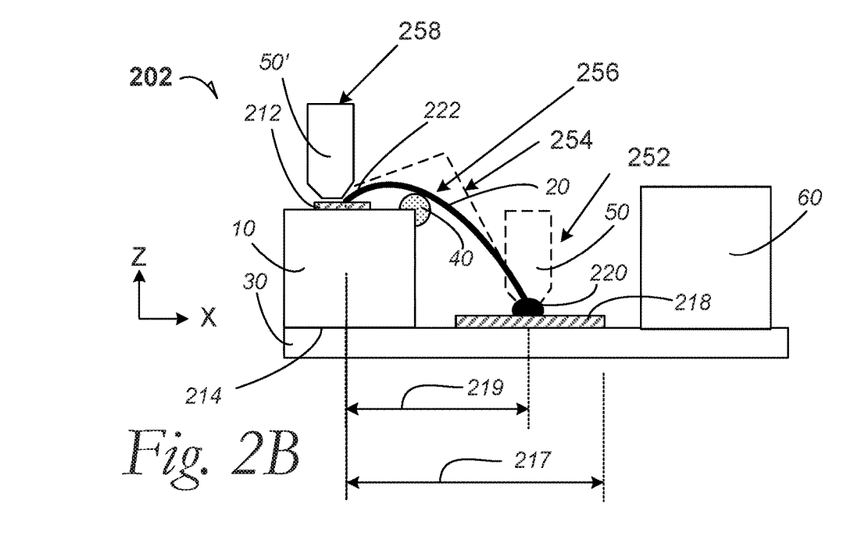
FIG. 2B is a cross-section elevation of a wire-bonded die demonstrating wire-bond processing during manufacture of a system in package according to an embodiment.

FIG. 2B is a cross-section elevation of a wire-bonded die 202 demonstrating wire-bond processing during manufacture of a system in package (SiP) according to an embodiment. A first die 10 is disposed on a package substrate 30 and a first bond wire 20 arcs over and touches a first dielectric ridge 40 between a first active surface bond pad 212 and a first bond finger 218. In an embodiment, the first bond wire 20 both arcs and touches the first dielectric ridge 40, as well as exhibits deflection near the first dielectric ridge 40. Processing is described by dashed lines and ghosted figures to show motion of a capillary device 50 (in ghosted outline) where it begins and where it ends 50'.

In an embodiment, the capillary device 50 both supplies bond-wire precursor material and heats the wire-precursor material to effect a useful bond-wire arc. In an embodiment, the capillary device 50 both supplies bond-wire precursor material and is moved in space to effect a useful bond-wire shape. In this embodiment, a capillary start position 252 creates a capillary start enlargement 220. A first movement is substantially diagonal (in the positive Z-direction as well as negative X-direction) as the capillary start position 252. Overall capillary movement is indicated by two linear movements of the capillary device 50 that traces out a capillary path 254 above- and touching the dielectric ridge 40 until a capillary end position 50' is reached. A resulting bond-wire shape 256 is depicted between the package substrate bond finger 218 and the first bond pad 212. A characteristic distance 219 is quantified by center-line projections from a center symmetry line of the capillary start enlargement 220 on the first bond finger 218 and the center of the first bond pad 212. Under similar dimensional conditions between the wire-bonded die and package substrate 201 (FIG. 2A) and the wire-bonded die and package substrate 202 (FIG. 2B) the first characteristic distance 217 (projected onto FIG. 2B) is larger than the second characteristic distance 219. Similar dimension conditions may be quantified in one embodiment by the total Z-elevation from the top of the first bond finger 218 to the top of the first bond pad 212. For example, where the wire diameter is about 25 micrometer, the total Z-elevation is less than 200 micrometer.

Also under similar dimensional conditions between the wire-bonded die and package substrate 201 (FIG. 2A) and the wire-bonded die and package substrate 202 (FIG. 2B) a lower overall Z-height is achieved in the wire-bonded die and package substrate 202 compared to the wire-bonded die and package substrate 201.

It may now be appreciated that the capillary start position may begin at the first bond pad to create a capillary start enlargement at the first bond pad 212 and not on the first bond finger 218.

After wirebonding, an additional component 60 may be placed on the package substrate 30 in a location that is closer to the first die 10 depicted in FIG. 2B by comparison to what would be possible to the first die 10 depicted in FIG. 2A. Consequently in an embodiment, where wire bonding is carried out to touch the dielectric ridge 40 in FIG. 2B, including one of mere touching or of causing the bond wire to deflect, a lower overall Z-height is achieved by the bond wire.

Figure 3:
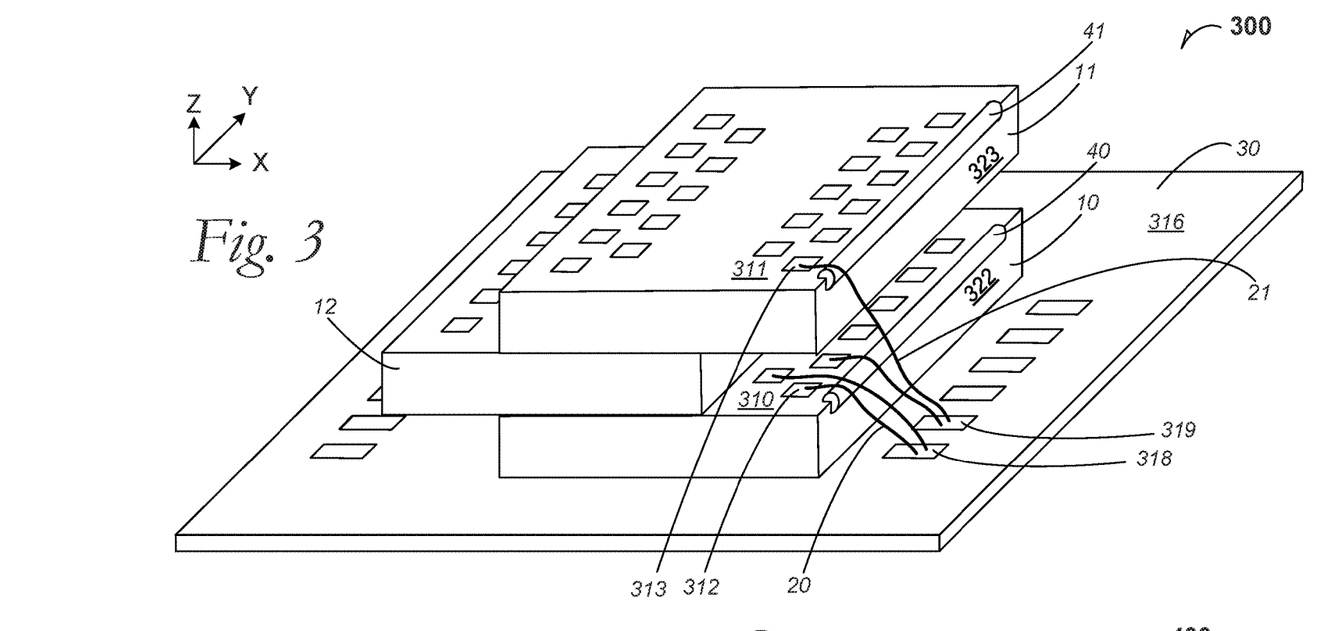
FIG. 3 is a perspective elevation of a semiconductive device in a package according to an embodiment.

FIG. 3 is a perspective elevation 300 of a semiconductive device in a system in package (SiP) according to an embodiment. A first bond wire 20 is configured between a first die 10 and a package substrate 30. The first die 10 includes an active surface 310 and a first bond pad 312. The first die 10 also includes a backside surface (not enumerated) that is disposed on the package substrate 30 against a mounting surface 316. The package substrate 30 includes a first package bond finger 318 on the mounting surface 316.

A first dielectric ridge 40 is disposed on and extending above the first die 10 at an edge that defines a corner between the active surface 310 and a first sidewall 322 of the first die 10. The first bond wire 20 is bonded to the first die bond pad 312 on the active surface 310, and the first bond wire 20 arcs above the first dielectric ridge 40 and the first bond wire 20 is bonded to the first bond finger 318 on the package substrate 30.

In an embodiment, the first bond wire 20 contacts the first dielectric ridge 40. In an embodiment, the first bond wire 20 both contacts and exhibits arc deflection at the first dielectric ridge 40. Consequently, the first bond wire 20 pivots at the first dielectric ridge 40 to obtain a lower Z-profile. Also with the first bond wire 20 both contacting and pivoting from the first dielectric ridge 40, the issue of wire sweep during protective overmolding and during other processing is diminished in favor of fewer bond wire-to-bond wire shorts. It may be appreciated where wire bonding causes the first bond wire 20 to deflect at the first dielectric ridge 40, a steeper wire angle may result between the first dielectric ridge 40 and the first bond finger 318.

In an embodiment, the first dielectric ridge 40 is cornice-configured on the active surface 110 and overhanging onto the first sidewall 322. Although the first dielectric ridge 40 is depicted as a semicircle profile that runs as a bead along the first die 10 in FIG. 3, it may be appreciated that although the first dielectric ridge 40 is depicted as a semicircle, actual processing may result in a non-circular cross-section profile. It may be appreciated that the first dielectric ridge 40 may only extend above the first active surface 310 sufficiently to prevent shorting of the first bond wire 20 onto the active surface 310. In any event where the first dielectric ridge 40 may be disposed only on the active surface 310, it is proximate the first sidewall 322.

A subsequent bond wire 21 is configured between a subsequent die 11 and the package substrate 30 where the subsequent die 11 is disposed above the first die 10. The subsequent die 11 includes an active surface 311 and a subsequent bond pad 311. The subsequent die 11 also includes a backside surface (not enumerated) that is disposed above the first die 10; in the illustrated embodiment upon an intervening structure 12 that is stacked above the first die 10 against the first die active surface 310. The package substrate 30 includes a subsequent package bond finger 319 on the mounting surface 316.

A subsequent dielectric ridge 41 is disposed on and extending above the subsequent die 11 at an edge that defines a corner between the active surface 311 and a subsequent sidewall 323 of the subsequent die 11. The subsequent bond wire 21 is bonded to the subsequent die bond pad 313 on the active surface 311, and the subsequent bond wire 21 arcs above the subsequent dielectric ridge 41 and the subsequent bond wire 21 is bonded to the subsequent bond finger 319 on the package substrate 30.

It may be seen that the first sidewall 322 and the subsequent sidewall 323 may be substantially co-planar in the Y-Z plane. In an embodiment, the first sidewall 322 and the subsequent sidewall are not substantially co-planar in the Y-Z plane such that the first sidewall 322 is farther to the right in the X-direction than that of the subsequent sidewall 323. In an embodiment, the first sidewall 322 and the subsequent sidewall are not substantially co-planar in the Y-Z plane such that the first sidewall 322 is farther to the left in the X-direction than that of the subsequent sidewall 323.

In an embodiment, the subsequent bond wire 21 contacts the subsequent dielectric ridge 41. In an embodiment, the subsequent bond wire 21 both contacts and exhibits arc deflection at the subsequent dielectric ridge 41. Consequently, the subsequent bond wire 21 pivots at the subsequent dielectric ridge 41 to obtain a lower Z-profile. Also with the subsequent bond wire 21 both contacting and pivoting from the subsequent dielectric ridge 41, the issue of wire sweep during protective overmolding and during other processing is diminished in favor of fewer bond wire-to-bond wire shorts.

In an embodiment, the subsequent dielectric ridge 41 is cornice-configured on the active surface 311 and overhanging onto the subsequent sidewall 323. Although the subsequent dielectric ridge 41 is depicted as a semicircle profile that runs as a bead along the subsequent die 11 in FIG. 3, it may be appreciated that although the subsequent dielectric ridge 41 is depicted as a semicircle, actual processing may result in a non-circular cross-section profile. It may be appreciated that the subsequent dielectric ridge 42 may only extend above the subsequent active surface 311 sufficiently to prevent shorting of the subsequent bond wire 21 onto the active surface 311. In any event where the subsequent dielectric ridge 41 may be disposed only on the active surface 311, it is proximate the subsequent sidewall 323.

It may be appreciated where wire bonding causes the subsequent bond wire 21 to deflect at the subsequent dielectric ridge 41, a steeper wire angle may result between the subsequent dielectric ridge 41 and the subsequent bond finger 319.

It can now be appreciated where a lower Z-height of the overall package is useful, the first bond wire 20 will have a clearance that is compatible with not touching the subsequent die 41 where the intervening structure 12 also has a Z-height. It can also now be understood where the intervening structure 12 is a second die 12, as illustrated a three-die stacked system in package 300 may be obtained.

Figure 4:
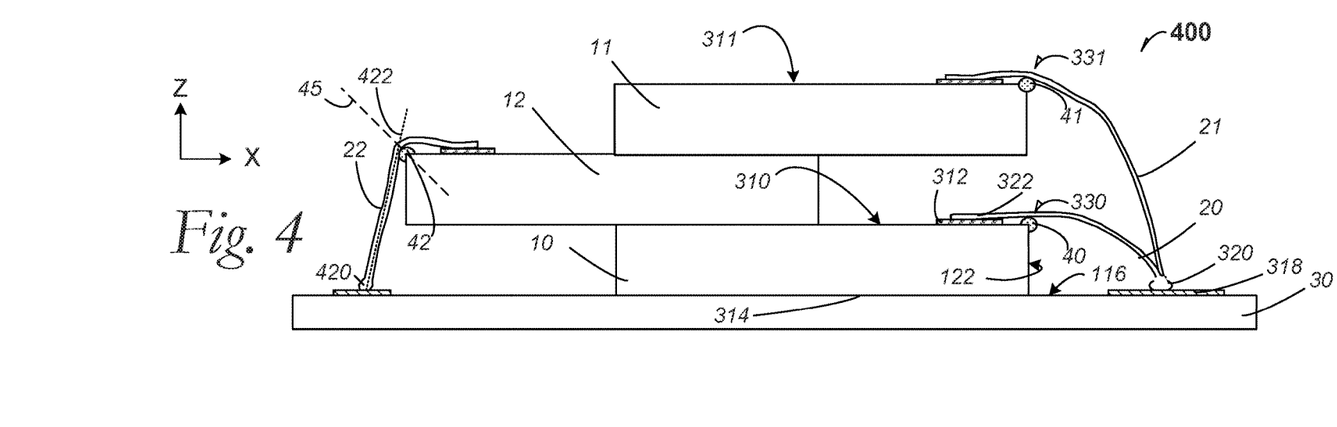
FIG. 4 is a cross-section elevation of the semiconductive device in a package depicted in FIG. 3 according to an embodiment.

FIG. 4 is a cross-section elevation 400 of the semiconductive device in a package 300 depicted in FIG. 3 according to an embodiment. The first die 10, the second structure 12 and the subsequent die 11 are stacked upon the package substrate 30. In an embodiment in addition to the first bond wire 20 and the subsequent bond wire 21, a second bond wire 22 is configured between a second die 12 and the package substrate 30 with a second dielectric ridge 42 allows the second bond wire 22 to deflect and pivot toward the package substrate 30 for a lower profile.

It may be appreciated where wire bonding causes, e.g., the second bond wire 22 to deflect at the second dielectric ridge 42, a steeper wire angle may result between the second dielectric ridge 42 and a second bond finger 312. Under rigorous processing conditions, tautness (and effectively uniform steepness) of the second bond wire 22 descent may be quantified by observing a symmetry line 422 being contained entirely within the body of the second bond wire 22 between a capillary start enlargement 420 and where the second bond wire 22 deflects at a 45-degree diagonal 45 emerging from the second die 12 at the corner at the second dielectric ridge 42.

In an embodiment, the wire-bond structures illustrated in each of FIGS. 2A and 2B and described herein may each be found in a single semiconductive device in a package. For example in FIG. 4, the bond-wire 20 embodiment depicted in FIG. 2A may be affixed where the second bond wire 22 is shown. This means although a second dielectric ridge 42 may be present, the bond wire arcs over the second dielectric ridge but does not contact it. Similarly in this embodiment, the subsequent bond wire 21 as illustrated arcs over and contacts the subsequent dielectric ridge 41 to achieve a minimum Z-profile, but the second bond wire has the thickness of the subsequent die 11 that allows for a wire-bond embodiment depicted in FIG. 2A.

Figure 5:
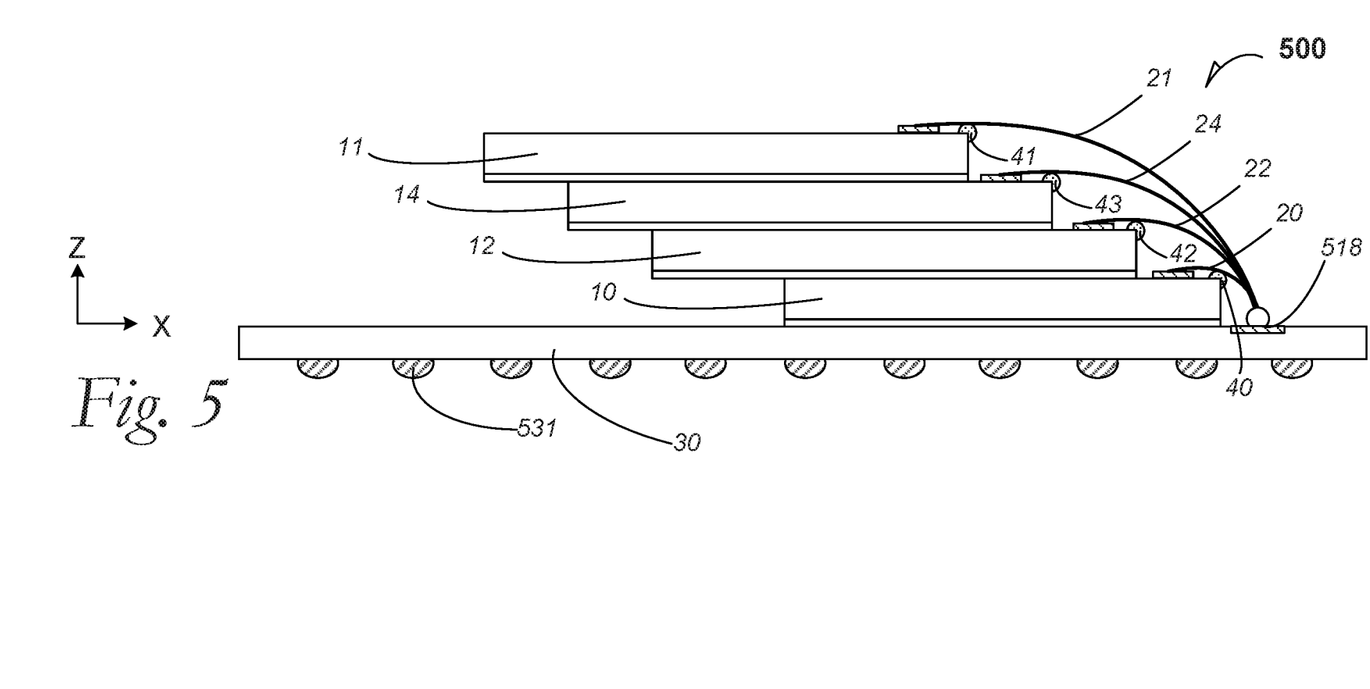
FIG. 5 is a cross-section elevation of a semiconductive device in a system in package according to an embodiment.

FIG. 5 is a cross-section elevation of a semiconductive device in a system in package (SiP) 500 according to an embodiment. A first die 10, a second die 12, a third die 14, and a subsequent die 11 are stair-stacked upon a package substrate 30. In an embodiment, the package substrate 30 is bumped with a series of landside bumps, one of which is indicated with reference numeral 531. It may be understood that a board that assembles at the landside bumps 531 may be a mother board that may be referred to as a landside substrate. It may be understood that a structure that assembles at the landside bumps 531 may be the outer shell of a computing device and it may be referred to as a landside substrate.

In an embodiment in addition to the first bond wire 20 and the subsequent bond wire 21, a second bond wire 22 is configured between a second die 12 and a bond pad (not necessarily illustrated) on the package substrate 30. The second bond wire 21 contacts, is deflected by, and is caused to pivot at a second dielectric ridge 42.

In an embodiment in addition to the first- second- and subsequent bond wires 20, 22 and 21, a third bond wire 24 is configured between a third die 14 and a bond pad (not necessarily illustrated) on the package substrate 30. The third bond wire 24 contacts, is deflected by, and is caused to pivot at a third dielectric ridge 43. In an embodiment, each sidewall for each die stacked sequentially above the first die 10 is shifted to the left in the X-direction such that the subsequent die 11 is farthest shifted to the left.

Figure 6:
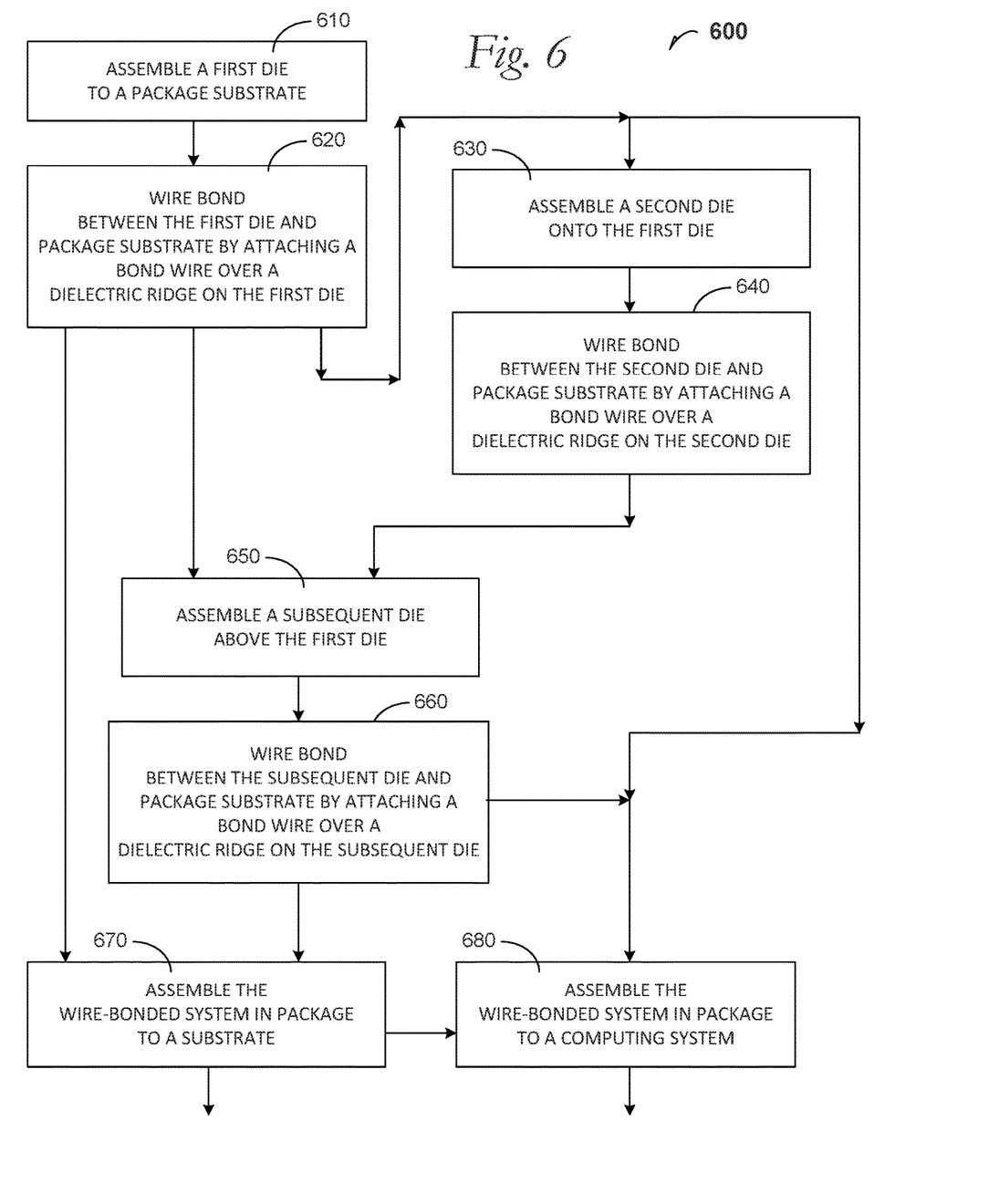
FIG. 6 is a process flow diagram that illustrates processing according to an embodiment.

FIG. 6 is a process flow diagram 600 that illustrates processing according embodiment.

At 610, the process includes assembling a first die to a package substrate. In a non-limiting example embodiment, a first die 10 is adhesively assembled to a package substrate 30 such as depicted in FIG. 1.

At 620, a wire bond is formed between the first die and the package substrate by attaching a bond wire over a dielectric ridge on the first die. In a non-limiting example embodiment, a first bond wire 20 arcs over the first dielectric ridge 40 on the first die 10, but does not touch the first dielectric ridge 40. In a non-limiting example embodiment, a first bond wire 20 arcs over the first dielectric ridge 40 on the first die 10, and touches the first dielectric ridge 40. In a non-limiting example embodiment, a first bond wire 20 arcs over the first dielectric ridge 40 on the first die 10, touches and pivots in direction at the first dielectric ridge 40. In a non-limiting example embodiment, a first bond wire 20 arcs over a first dielectric ridge 40 on the first die 10, touches and pivots at the first dielectric ridge 40, and the first bond wire is affixed at a tautness such that a symmetry line is contained entirely within the body of the first bond wire 20 between a capillary start enlargement on the first bond finger 120 and where the first bond wire 20 deflects at a 45-degree diagonal emerging from the first die 10 at the corner at the first dielectric ridge 40.

At 630, the process includes optionally assembling a second die onto a first die. In a non-limiting example embodiment, the second die 12 is assembled onto the first die 10 as depicted in FIG. 4.

At 640, the process includes wire bonding between the second die and the package substrate by attaching a bond wire over a second dielectric ridge on the second die. In a non-limiting example embodiment, a second bond wire 22 arcs over a second dielectric ridge 42 on the second die 12, touches and pivots at the second dielectric ridge 42, and the second bond wire is affixed at a tautness such that the symmetry line 422 is contained entirely within the body of the second bond wire 22 between the capillary start enlargement 420 and where the second bond wire 22 deflects at a 45-degree diagonal 45 emerging from the second die 12 at the corner at the second dielectric ridge 42.

At 650, the process includes assembling a subsequent die to a package substrate. In a non-limiting example embodiment, a subsequent die 11 is adhesively assembled to a package substrate 30 such as depicted in FIG. 3.

At 660, a wire bond is formed between the subsequent die and the package substrate by attaching a subsequent bond wire over a subsequent dielectric ridge on the subsequent die. In a non-limiting example embodiment, a subsequent bond wire 21 arcs over the subsequent dielectric ridge 41 on the subsequent die 11, but does not touch the subsequent dielectric ridge 41. In a non-limiting example embodiment, a subsequent bond wire 21 arcs over the subsequent dielectric ridge 41 on the subsequent die 11, and touches the subsequent dielectric ridge 41. In a non-limiting example embodiment, a subsequent bond wire 21 arcs over the subsequent dielectric ridge 41 on the subsequent die 11, touches and pivots in direction at the subsequent dielectric ridge 41. In a non-limiting example embodiment, a subsequent bond wire 21 arcs over a subsequent dielectric ridge 41 on the subsequent die 11, touches and pivots at the subsequent dielectric ridge 41, and the subsequent bond wire is affixed at a tautness such that a symmetry line is contained entirely within the body of the subsequent bond wire 21 between a capillary start enlargement on the subsequent bond finger 319 and where the subsequent bond wire 21 deflects at a 45-degree diagonal 45 emerging from the subsequent die 11 at the corner at the subsequent dielectric ridge 41.

At 670, the process includes assembling the wire-bonded SiP to a substrate. In a non-limiting example embodiment, the SiP depicted in FIG. 5 is assembled to a board such as one configured to be bumped with a series of landside bumps, one of which is indicated with reference numeral 531.

Figure 7:
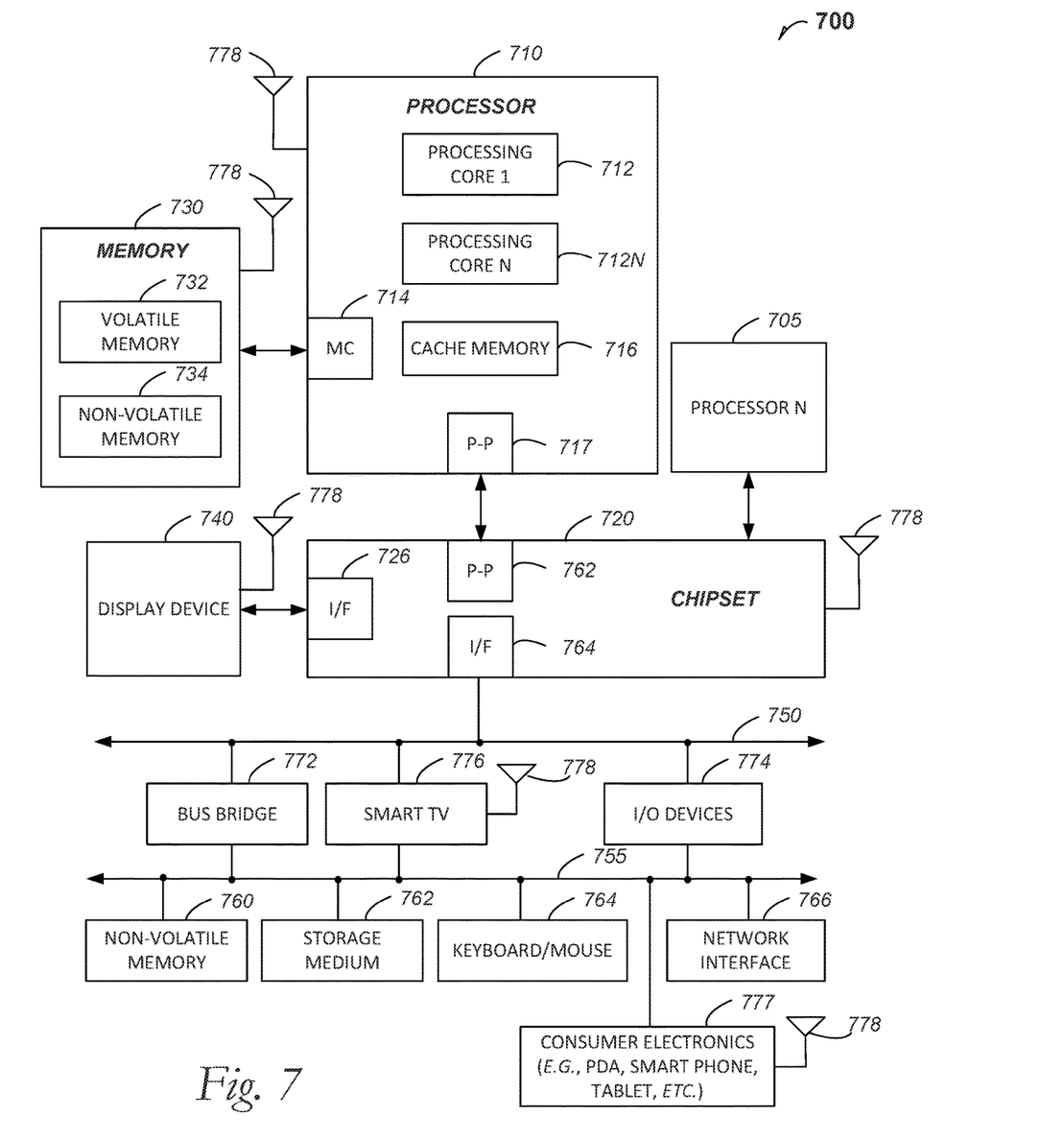
FIG. 7 is a computing system according to an embodiment.

At 680, the process includes assembling a wire-bonded SiP embodiment to a computing system. Further discussion of computing system 700 embodiments are set forth herein.

FIG. 7 is a computing system 700 according to an embodiment. FIG. 7 illustrates a system level diagram, according to one embodiment of the invention. For instance, FIG. 7 depicts an example of a microelectronic device that includes a wire-bonded SiP embodiment as described in the present disclosure.

FIG. 7 is included to show an example of a higher level device application for the stair-stacked memory module SiP embodiments. In one embodiment, a system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the wire-bonded SiP embodiment is part of a computing system 700.

In an embodiment, the processor 710 has one or more processing cores 712 and 712N, where 712N represents the Nth processor core inside processor 710 where N is a positive integer. In an embodiment, the electronic device system 700 using a wire-bonded SiP embodiment includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the wire-bonded SiP embodiment computing system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a semiconductive bridge as set forth in this disclosure. The chipset 720 enables the processor 710 to connect to other elements in the wire-bonded SiP embodiment system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a single SOC such as selected stair-stacked memory module SiP embodiments described herein. Additionally, the chipset 720 connects to one or more buses 750 and 755 that interconnect various elements 774, 760, 762, 764, and 766. Buses 750 and 755 may be interconnected together via a bus bridge 772. In an embodiment, the chipset 720 couples with a non-volatile memory 760, a mass storage device(s) 662, a keyboard/mouse 664, and a network interface 766 by way of at least one of the interface 724 and 704, the smart TV 776, and the consumer electronics 777, etc.

In and embodiment, the mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the stair-stacked memory module SiP computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

In an embodiment, the computing system 700 is contained in an outer shell that houses any first-die embodiment. In an embodiment, the package substrate 30 is sufficiently constructed to allow internal traces mating to the bond fingers, e.g. bond finger 118, but the surface opposite the bond finger is sufficiently insulated that it is the outer shell (indicated at Item 29 in FIG. 1) of a computing device. In an embodiment the outer shell is a board to which the package substrate is to be mounted, e.g. the package substrate 30 in FIG. 5.

EXAMPLES

To illustrate the compact wirebonding embodiments and methods disclosed herein, a non-limiting list of examples is provided herein:

Example 1 is a semiconductive device in a package comprising: a first die, wherein the first die includes an active surface, a first sidewall, and a backside surface; a package substrate, wherein the first die backside surface is disposed on the package substrate; a first dielectric ridge disposed on and extending above the first die at an edge that defines a corner between the active surface and the first sidewall; and a first bond wire that is bonded to a first die bond pad on the active surface, that arcs above the first dielectric ridge, and that is bonded to a first bond finger on the package substrate.

In Example 2, the subject matter of Example 1 optionally includes wherein the first bond wire contacts the first dielectric ridge.

In Example 3, the subject matter of any one or more of Examples 1-2 optionally include wherein the first bond wire contacts and exhibits arc deflection at the first dielectric ridge.

In Example 4, the subject matter of any one or more of Examples 1-3 optionally include wherein the first dielectric ridge is cornice-configured on the active surface and on the first sidewall.

In Example 5, the subject matter of any one or more of Examples 1-4 optionally include wherein the first dielectric ridge is disposed only on the active surface and is proximate the first sidewall.

In Example 6, the subject matter of any one or more of Examples 1-5 optionally include wherein the first sidewall and the first bond wire at the first dielectric ridge define an angle, wherein the angle is at most a right angle.

In Example 7, the subject matter of any one or more of Examples 1-6 optionally include wherein the first bond wire follows a symmetry line between a capillary start enlargement on the first bond finger and the symmetry line is within the first bond-wire body between the capillary start enlargement and the first bond wire where it touches the first dielectric ridge and deflects at an intersection of the symmetry line at a 45-degree diagonal that emerges from the first die at the corner at the first dielectric ridge.

In Example 8, the subject matter of any one or more of Examples 1-7 optionally include a subsequent die disposed above the first die, wherein the subsequent die includes a subsequent die active surface, a first sidewall, and a backside surface; a subsequent dielectric ridge disposed on the subsequent die at an edge that defines a corner between the active surface and the first sidewall; and a subsequent bond wire that is bonded to a subsequent die bond pad on the active surface, that arcs above the subsequent dielectric ridge, and that is bonded to a first bond finger on the package substrate.

In Example 9, the subject matter of Example 8 optionally includes wherein the subsequent bond wire contacts the subsequent dielectric ridge.

In Example 10, the subject matter of any one or more of Examples 8-9 optionally include wherein the subsequent bond wire contacts and exhibits arc deflection at the subsequent dielectric ridge.

In Example 11, the subject matter of any one or more of Examples 1-10 optionally include a second die disposed on the first die, wherein the second die includes a second die active surface, a second sidewall, and a backside surface; a second dielectric ridge disposed on the subsequent die at an edge that defines a corner between the active surface and the second sidewall; a second bond wire that is bonded to a subsequent die bond pad on the active surface, that arcs above the second dielectric ridge, and that is bonded to a second bond finger on the package substrate; a subsequent die disposed above the second die, wherein the subsequent die includes a subsequent die active surface, a subsequent sidewall, and a backside surface; a subsequent dielectric ridge disposed on the subsequent die at an edge that defines a corner between the active surface and the subsequent sidewall; and a subsequent bond wire that is bonded to a subsequent die bond pad on the active surface, that arcs above the subsequent dielectric ridge, and that is bonded to a subsequent bond finger on the package substrate.

In Example 12, the subject matter of any one or more of Examples 1-11 optionally include an intervening structure disposed on the first die, wherein the intervening structure includes an intervening structure upper surface, an intervening structure sidewall, and a backside surface; an intervening structure dielectric ridge disposed on the intervening structure at an edge that defines a corner between the intervening structure upper surface and the intervening structure sidewall; an intervening structure bond wire that is bonded to an intervening structure die bond pad on the intervening structure upper surface, that arcs above the intervening structure dielectric ridge, and that is bonded to an intervening structure bond finger on the package substrate; a subsequent die disposed above the intervening structure, wherein the subsequent die includes a subsequent die active surface, a subsequent sidewall, and a backside surface; a subsequent dielectric ridge disposed on the subsequent die at an edge that defines a corner between the active surface and the subsequent sidewall; and a subsequent bond wire that is bonded to a subsequent die bond pad on the active surface, that arcs above the subsequent dielectric ridge, and that is bonded to a subsequent bond finger on the package substrate.

In Example 13, the subject matter of any one or more of Examples 1-12 optionally include an intervening structure disposed on the first die, wherein the intervening structure includes an intervening structure upper surface, an intervening structure sidewall, and a backside surface; a subsequent die disposed above the intervening structure, wherein the subsequent die includes a subsequent die active surface, a subsequent sidewall, and a backside surface; a subsequent dielectric ridge disposed on the subsequent die at an edge that defines a corner between the active surface and the subsequent sidewall; and a subsequent bond wire that is bonded to a subsequent die bond pad on the active surface, that arcs above the subsequent dielectric ridge, and that is bonded to a subsequent bond finger on the package substrate.

Example 14 is a method of assembling a wire-bonded die, comprising: assembling a first die to a package substrate; and wire bonding between the first die and the package substrate by attaching a first bond wire to a first bond pad and over a first dielectric ridge on the first die, and onto a first bond finger on the package substrate.

In Example 15, the subject matter of Example 14 optionally includes assembling a subsequent die to the package substrate above the first die; and wire bonding between the subsequent die and the package substrate by attaching a subsequent bond wire over a subsequent dielectric ridge on the subsequent die.

In Example 16, the subject matter of any one or more of Examples 14-15 optionally include assembling a second die to the first die; wire bonding between the second die and the package substrate by attaching a second bond wire over a second dielectric ridge on the second die; assembling a subsequent die to the package substrate above the second die; and wire bonding between the subsequent die and the package substrate by attaching a subsequent bond wire over a subsequent dielectric ridge on the subsequent die.

In Example 17, the subject matter of any one or more of Examples 14-16 optionally include assembling an intervening structure above the first die, wherein the intervening structure is shifted sufficient to expose the first bond pad; assembling a subsequent die to the package substrate above the intervening structure; and wire bonding between the subsequent die and the package substrate by attaching a subsequent bond wire over a subsequent dielectric ridge on the subsequent die.

In Example 18, the subject matter of any one or more of Examples 14-17 optionally include assembling an intervening structure above the first die, wherein the intervening structure is shifted sufficient to expose the first bond pad; assembling a subsequent die to the package substrate above the intervening structure, wherein the first die and the subsequent each have respective first- and subsequent sidewalls proximate respective dielectric ridges such that the first- and subsequent sidewalls are substantially co-planar; and wire bonding between the subsequent die and the package substrate by attaching a subsequent bond wire over a subsequent dielectric ridge on the subsequent die.

In Example 19, the subject matter of any one or more of Examples 14-18 optionally include assembling an intervening structure above the first die, wherein the intervening structure is shifted sufficient to expose the first bond pad; assembling a subsequent die to the package substrate above the intervening structure, wherein the first die and the subsequent each have respective first- and subsequent sidewalls proximate respective dielectric ridges such that the subsequent sidewall is shifted to expose the first die at the first bond pad; and wire bonding between the subsequent die and the package substrate by attaching a subsequent bond wire over a subsequent dielectric ridge on the subsequent die. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In Example 20, the subject matter of any one or more of Examples 14-19 optionally include assembling the first die and package substrate to a landside substrate.

Example 21 is a computing system including a wire-bonded die, comprising: a first die, wherein the first die includes an active surface, a first sidewall, and a backside surface; a package substrate, wherein the first die backside surface is disposed on the package substrate; a first dielectric ridge disposed on and extending above the first die at an edge that defines a corner between the active surface and the first sidewall; a first bond wire that is bonded to a first die bond pad on the active surface, that arcs above the first dielectric ridge, and that is bonded to a first bond finger on the package substrate; and an outer shell that houses the first die.

In Example 22, the subject matter of Example 21 optionally includes wherein the outer shell is a landside substrate coupled to the first die.

In Example 23, the subject matter of any one or more of Examples 21-22 optionally include a subsequent die disposed above the first die, wherein the subsequent die includes a subsequent die active surface, a first sidewall, and a backside surface; a subsequent dielectric ridge disposed on the subsequent die at an edge that defines a corner between the active surface and the first sidewall; and a subsequent bond wire that is bonded to a subsequent die bond pad on the active surface, that arcs above the subsequent dielectric ridge, and that is bonded to a first bond finger on the package substrate.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like.

Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductive device in a package comprising:
a first die, wherein the first die includes an active surface, a first sidewall, and a backside surface;
a package substrate, wherein the first die backside surface is disposed on the package substrate;
a first dielectric ridge disposed on and extending above the first die at an edge that defines a corner between the active surface and the first sidewall; and
a first bond wire that is bonded to a first die bond pad on the active surface, that arcs above the first dielectric ridge, and that is bonded to a first bond finger on the package substrate, wherein the first bond wire follows a symmetry line between a capillary start enlargement on the first bond finger and the symmetry line is within the first bond-wire body between the capillary start enlargement and the first bond wire where it touches the first dielectric ridge and deflects at an intersection of the symmetry line at a 45-degree diagonal that emerges from the first die at the corner at the first dielectric ridge.

2. A semiconductive device in a package comprising:
a first die, wherein the first die includes an active surface, a first sidewall, and a backside surface;
a package substrate, wherein the first die backside surface is disposed on the package substrate;
a first dielectric ridge disposed on and extending above the first die at an edge that defines a corner between the active surface and the first sidewall; and
a first bond wire that is bonded to a first die bond pad on the active surface, that arcs above the first dielectric ridge, and that is bonded to a first bond finger on the package substrate, further including:
a second die disposed on the first die, wherein the second die includes a second die active surface, a second sidewall, and a backside surface;
a second dielectric ridge disposed on the second die at an edge that defines a corner between the active surface and the second sidewall;

a second bond wire that is bonded to a subsequent die bond pad on the active surface, that arcs above the second dielectric ridge, and that is bonded to a second bond finger on the package substrate;

a subsequent die disposed above the second die, wherein the subsequent die includes a subsequent die active surface, a subsequent sidewall, and a backside surface;

a subsequent dielectric ridge disposed on the subsequent die at an edge that defines a corner between the active surface and the subsequent sidewall; and a subsequent bond wire that is bonded to a subsequent die bond pad on the active surface, that arcs above the subsequent dielectric ridge, and that is bonded to a subsequent bond finger on the package substrate.

3. A semiconductive device in a package comprising:

a first die, wherein the first die includes an active surface, a first sidewall, and a backside surface;

a package substrate, wherein the first die backside surface is disposed on the package substrate;

a first dielectric ridge disposed on and extending above the first die at an edge that defines a corner between the active surface and the first sidewall; and a first bond wire that is bonded to a first die bond pad on the active surface, that arcs above the first dielectric ridge, and that is bonded to a first bond finger on the package substrate, further including:

an intervening structure disposed on the first die, wherein the intervening structure includes an intervening structure upper surface, an intervening structure sidewall, and a backside surface;

an intervening structure dielectric ridge disposed on the intervening structure at an edge that defines a corner between the intervening structure upper surface and the intervening structure sidewall;

an intervening structure bond wire that is bonded to an intervening structure die bond pad on the intervening structure upper surface, that arcs above the intervening structure dielectric ridge, and that is bonded to an intervening structure bond finger on the package substrate;

a subsequent die disposed above the intervening structure, wherein the subsequent die includes a subsequent die active surface, a subsequent sidewall, and a backside surface;

a subsequent dielectric ridge disposed on the subsequent die at an edge that defines a corner between the active surface and the subsequent sidewall; and a subsequent bond wire that is bonded to a subsequent die bond pad on the active surface, that arcs above the subsequent dielectric ridge, and that is bonded to a subsequent bond finger on the package substrate.

4. A semiconductive device in a package comprising:

a first die, wherein the first die includes an active surface, a first sidewall, and a backside surface;

a package substrate, wherein the first die backside surface is disposed on the package substrate;

a first dielectric ridge disposed on and extending above the first die at an edge that defines a corner between the active surface and the first sidewall; and a first bond wire that is bonded to a first die bond pad on the active surface, that arcs above the first dielectric ridge, and that is bonded to a first bond finger on the package substrate, further including:

an intervening structure disposed on the first die, wherein the intervening structure includes an intervening structure upper surface, an intervening structure sidewall, and a backside surface;

a subsequent die disposed above the intervening structure, wherein the subsequent die includes a subsequent die active surface, a subsequent sidewall, and a backside surface;

a subsequent dielectric ridge disposed on the subsequent die at an edge that defines a corner between the active surface and the subsequent sidewall; and a subsequent bond wire that is bonded to a subsequent die bond pad on the active surface, that arcs above the subsequent dielectric ridge, and that is bonded to a subsequent bond finger on the package substrate.

5. A method of assembling a wire-bonded die, comprising:

assembling a first die to a package substrate; and wire bonding between the first die and the package substrate by attaching a first bond wire to a first bond pad and over a first dielectric ridge on the first die, and onto a first bond finger on the package substrate, further including:

assembling a second die to the first die;

wire bonding between the second die and the package substrate by attaching a second bond wire over a second dielectric ridge on the second die;

assembling a subsequent die to the package substrate above the second die; and wire bonding between the subsequent die and the package substrate by attaching a subsequent bond wire over a subsequent dielectric ridge on the subsequent die.

6. A method of assembling a wire-bonded die, comprising:

assembling a first die to a package substrate; and wire bonding between the first die and the package substrate by attaching a first bond wire to a first bond pad and over a first dielectric ridge on the first die, and onto a first bond finger on the package substrate, further including:

assembling an intervening structure above the first die, wherein the intervening structure is shifted sufficient to expose the first bond pad;

assembling a subsequent die to the package substrate above the intervening structure; and wire bonding between the subsequent die and the package substrate by attaching a subsequent bond wire over a subsequent dielectric ridge on the subsequent die.

7. The method of claim 6, further including:

wherein the first die and the subsequent each have respective first- and subsequent sidewalls proximate respective dielectric ridges such that the first- and subsequent sidewalls are substantially co-planar.

8. The method of claim 6, further including:

wherein the first die and the subsequent each have respective first- and subsequent sidewalls proximate respective dielectric ridges such that the subsequent sidewall is shifted to expose the first die at the first bond pad.

9. A method of assembling a wire-bonded die, comprising:

assembling a first die to a package substrate; and wire bonding between the first die and the package substrate by attaching a first bond wire to a first bond pad and over a first dielectric ridge on the first die, and onto a first bond finger on the package substrate, further including assembling the first die and package substrate to a landside substrate.

* * * * *